(12) United States Patent
Cao et al.

(10) Patent No.: US 9,853,001 B1
(45) Date of Patent: Dec. 26, 2017

(54) PREVENTION OF REVERSE ENGINEERING OF SECURITY CHIPS

(71) Applicant: International Business Machines Corporation, Armonk, NY (US)

(72) Inventors: Qing Cao, Yorktown Heights, NY (US); Kangguo Cheng, Schenectady, NY (US); Zhengwen Li, Chicago, IL (US); Fei Liu, Millwood, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/195,149

(22) Filed: Jun. 28, 2016

(51) Int. Cl.
*H01L 21/56* (2006.01)
*H01L 23/00* (2006.01)
*H01L 23/31* (2006.01)

(52) U.S. Cl.
CPC .............. *H01L 23/57* (2013.01); *H01L 21/56* (2013.01); *H01L 23/3142* (2013.01)

(58) Field of Classification Search
CPC . H01L 23/573; H01L 27/0629; H01L 29/788; H01L 28/10; H01L 28/20; H01L 24/40; H01L 29/4916; H01L 27/2703; H01L 23/57; H01L 21/56; H01L 23/3142
See application file for complete search history.

(56) References Cited

U.S. PATENT DOCUMENTS

| | | | |
|---|---|---|---|
| 3,882,323 A | | 5/1975 | Smolker |
| 5,030,796 A | * | 7/1991 | Swanson ................ H01L 23/24 |
| | | | 174/524 |
| 5,821,582 A | * | 10/1998 | Daum ................... H01L 23/573 |
| | | | 257/327 |
| 7,835,955 B1 | | 11/2010 | Brodsky et al. |
| 8,288,857 B2 | | 10/2012 | Das et al. |
| 8,332,661 B2 | | 12/2012 | Mostovych |
| 8,610,256 B2 | | 12/2013 | Fornara et al. |
| 8,730,715 B2 | | 5/2014 | Katti et al. |
| 2010/0049991 A1 | | 2/2010 | Frenkel et al. |
| 2012/0039117 A1 | | 2/2012 | Webb |
| 2013/0093081 A1 | * | 4/2013 | Lin ......................... H01L 24/11 |
| | | | 257/737 |

OTHER PUBLICATIONS

Kerr, Samuel, T.; "Secure Physical System Design Leveraging PUF Technology"; Purdue University; p. 1-87; May 2012.
Therriault, Daniel, et al.; "Chaotic Mixing in Three-Dimensional Microvascular Networks Fabricated by Direct-Write Assembly"; Nature Materials; vol. 2; p. 265-271 and 347; Apr. and May, 2003.
Wang, Fei, et al.; "2FLIP: A Two-Factor Lightweight Privacy-Preserving Authentication Scheme for VANET"; IEEE Transactions on Vehicular Technology; vol. 65, No. 2; p. 896-911; Feb. 2016.

* cited by examiner

*Primary Examiner* — Moin Rahman
(74) *Attorney, Agent, or Firm* — Cantor Colburn LLP; Vazken Alexanian

(57) ABSTRACT

A semiconductor chip includes a chip substrate; a self-destructive layer arranged on the chip substrate, the self-destructive layer including a pyrophoric reactant; and a sealant layer arranged on a surface of the self-destructive layer, on sidewalls of the self-destructive layer, and on the chip substrate such that the sealant layer forms a package seal on the semiconductor chip; wherein the pyrophoric reactant ignites spontaneously upon exposure to air.

7 Claims, 13 Drawing Sheets

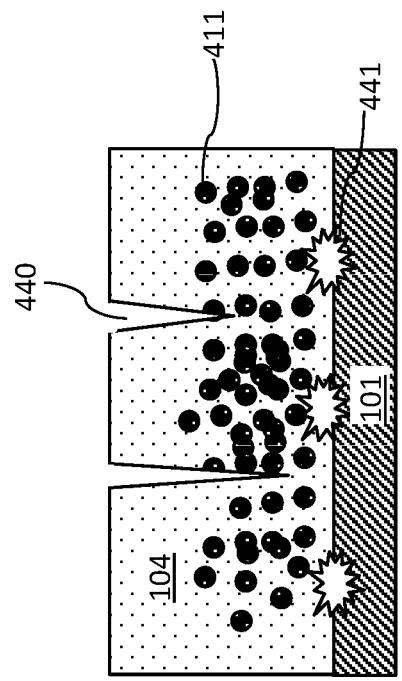
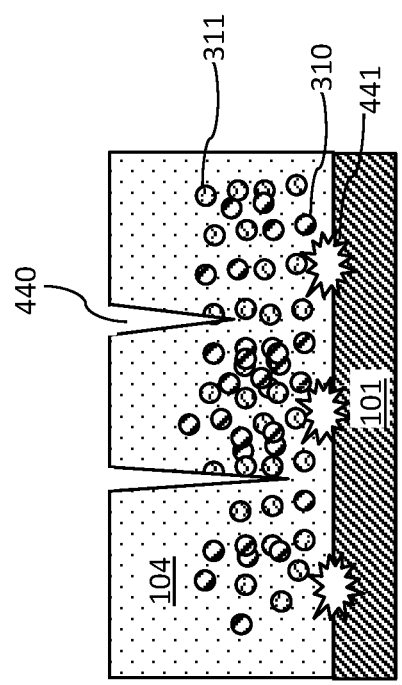
FIG. 5B
FIG. 5A

PREVENTION OF REVERSE ENGINEERING OF SECURITY CHIPS

BACKGROUND

The present invention relates to semiconductor chips, and more specifically, to structures and methods to prevent reverse engineering of semiconductor chips.

The development of microelectronic circuitry (e.g., semiconductor chips) is an active area of technological advancement that includes substantial economic and infrastructure resources. To recoup their investment and maintain a competitive position in the marketplace, microelectronic device manufacturers strive to protect their cutting-edge technologies from unauthorized disclosure.

Once the development of microelectronic components reaches the manufacturing stage and the devices are distributed to customers, or otherwise fall into the hands of third parties, manufacturers may lose control over their respective technologies. At that point, undesired reverse engineering by third parties may become a concern.

SUMMARY

According to an embodiment, a semiconductor chip includes a chip substrate; a self-destructive layer arranged on the chip substrate, the self-destructive layer including a pyrophoric reactant; and a sealant layer arranged on a surface of the self-destructive layer, on sidewalls of the self-destructive layer, and on the chip substrate such that the sealant layer forms a package seal on the semiconductor chip; wherein the pyrophoric reactant ignites spontaneously upon exposure to air.

According to another embodiment, a semiconductor chip includes a chip substrate; a self-destructive layer arranged on the chip substrate, the self-destructive layer including a first microcapsule including a first reactant and a second microcapsule including a second reactant, the first reactant or the second reactant being a pyrophoric substance; and a sealant layer arranged on a surface of the self-destructive layer, on sidewalls of the self-destructive layer, and on the chip substrate such that the sealant layer forms a package seal on the semiconductor chip; wherein the first reactant and the second reactant ignite spontaneously after being combined.

Yet, according to another embodiment, a method of making a semiconductor chip includes providing a chip substrate; forming a self-destructive layer on the chip substrate, the self-destructive layer including a pyrophoric reactant; and depositing a sealant layer on a surface of the self-destructive layer, on sidewalls of the self-destructive layer, and on the chip substrate such that the sealant layer forms a package seal on the semiconductor chip; wherein the pyrophoric reactant ignites spontaneously upon exposure to humid air and produces a byproduct that damages the chip substrate.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1A-1F illustrate methods for forming and sealing a self-destructive layer on a chip substrate according to an embodiment, in which:

FIG. 1A is a cross-sectional side view of a chip substrate;

FIG. 1B is a cross-sectional side view of a separation layer arranged on the chip substrate;

FIG. 1C is a cross-sectional side view of a self-destructive layer arranged on the separation layer;

FIG. 1D is a cross-sectional side view after optionally etching the separation layer and the self-destructive layer;

FIG. 1E is a cross-sectional side view after depositing a sealant layer on the self-destructive layer;

FIG. 1F is a cross-sectional side view of the chip package highlighting a region of the self-destructive layer;

FIG. 5A illustrates damage occurring to the chip substrate upon an attempt to open the sealant layer;

FIG. 5B illustrates damage occurring to the chip substrate upon an attempt to open the sealant layer;

DETAILED DESCRIPTION

The microprocessor element of the semiconductor chip package includes the sensitive, cutting-edge technology that is sought to be protected from disclosure. Third parties may isolate the chip for detailed evaluation by removing it from the chip package by, for example, grinding, breaking, or separating (e.g., cutting) the substrate or lid to expose the microprocessor chip. The exposed microprocessor chip may then be analyzed with a suitable device, such as a microscope, an elemental analytical device, or an electrical measurement instrument, thereby enabling the unauthorized third party to gain access to valuable trade secret information. Lockable cases or the like are insufficient because these may be cut away and removed to expose the chip substrate, which may then be reverse engineered as described above.

Third parties, after coming into physical possession of the sensitive technological devices, can take devices to a laboratory and manipulate them at will. Therefore, there is a need to provide a chip level package that will frustrate or defeat third party attempts to reverse engineer sensitive technologies, even when the third parties have uninhibited access to the chip package.

Accordingly, described herein are devices and methods that destroy semiconductor chips, for example, chips used by military or security agencies, if a third party attempts to tamper with a chip to reverse engineer the components. In embodiments, any tampering, for example any mechanical breaking, performed by a third party results in the chip being destroyed. Methods and structures for preventing reverse engineering of security chips using an on-package self-destructive layer are provided. During typical chip operation, the self-destructive layer remains intact. However, following attempts to tamper with and/or reverse engineer the chip by opening the package, the self-destructive layer is triggered and destroys the chip.

Figure 1A:
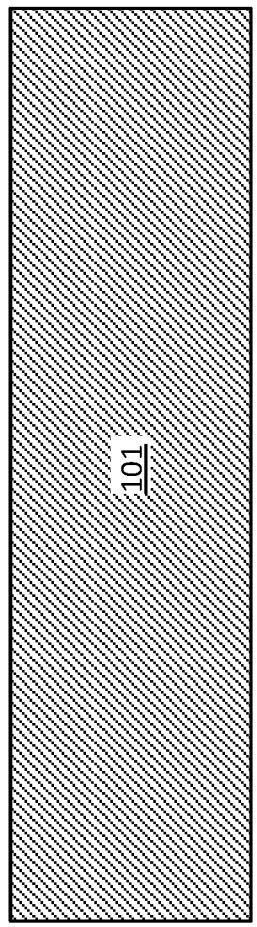

Turning now to the Figures, FIGS. 1A-1F illustrate methods for forming and sealing a self-destructive layer on a chip substrate according to one or more embodiments. FIG. 1A is a cross-sectional side view of a chip substrate 101. The chip substrate 101 is any semiconductor chip or any security chip. The chip substrate 101 may be, for example, a board, a die, or a wafer. The chip substrate 101 may include or more semiconductor materials and may include, but is not limited to, Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof. The chip substrate 101 may further include any additional layers, packaging, or circuitry.

Figure 1B:
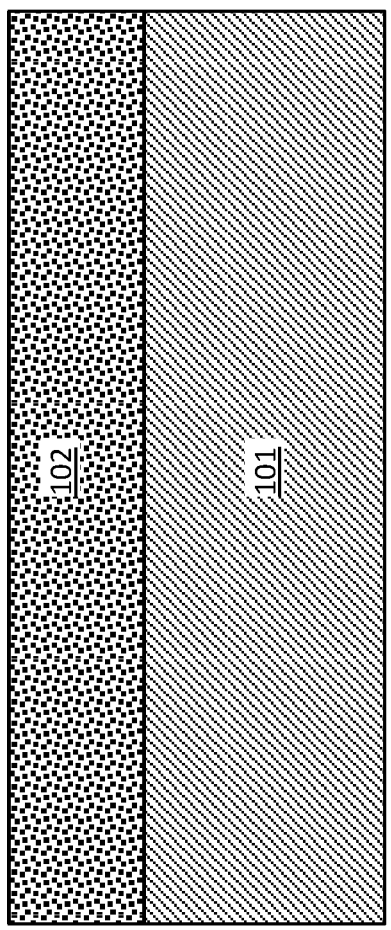

FIG. 1B is a cross-sectional side view of a separation layer 102 arranged on the chip substrate 101. The separation layer 102 connects and separates the self-destructive layer 103 (see FIG. 1C) from the chip substrate 101. The separation layer 102 may be any material(s) that can be used to adhere or embed the self-destructive layer 103 on the chip substrate 101. Non-limiting examples of material(s) for the separation layer 102 include dielectric oxides, for example, silicon dioxide, or polymeric materials.

When a separation layer 102 is used, the thickness of the separation layer 102 generally varies and depends on the composition of the self-destructive layer 103. The separation layer 102 should be thick enough to effectively separate the reactive self-destructive layer 103 from the chip substrate 101 so that the chip substrate 101 is not unintentionally damaged or destroyed during routine or normal operation. In some embodiments, the separation layer 102 has a thickness in a range from about 10 nm to about 10 micrometers, or in a range from about 10 nm to about 200 nm.

Figure 1C:
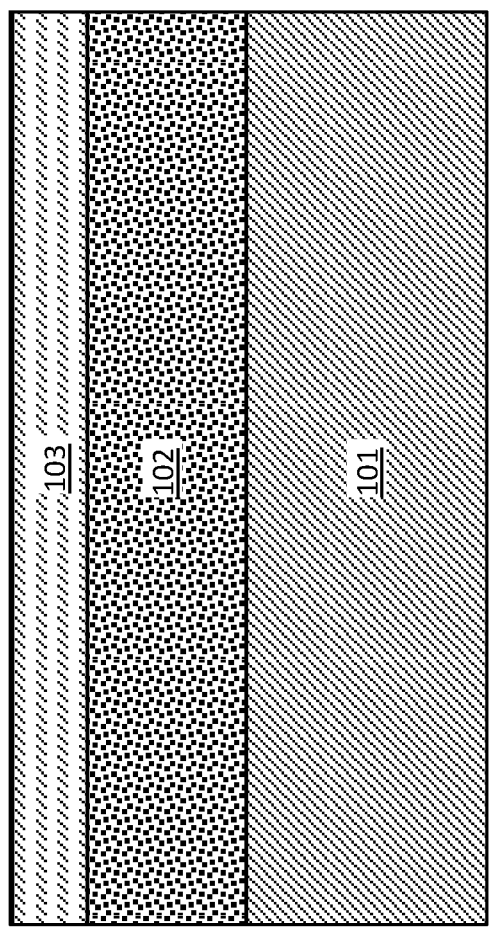

FIG. 1C is a cross-sectional side view of a self-destructive layer 103 arranged on the separation layer 102. The separation layer 102 is disposed between the chip substrate 101 and the self-destructive layer 103. The self-destructive layer 103, which is described in further detail below, includes one or more compounds, layers, and/or materials that are sealed separately, which is also described below. When the package around the self-destructive layer 103 and the chip substrate 101 are tampered with, for example, when someone attempts to open the package to analyze or reverse engineer the chip, the self-destructive layer 103 self-destructs by a chemical and/or physical reaction that also induces destruction of the chip substrate 101. The thickness of the self-destructive layer 103 generally varies and depends on the compositions of the materials and the applications.

Figure 1D:
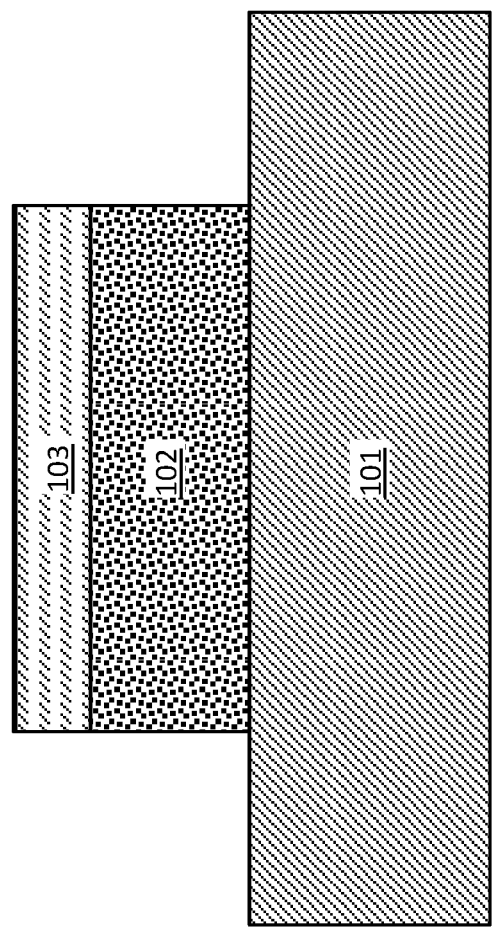
Figure 1E:
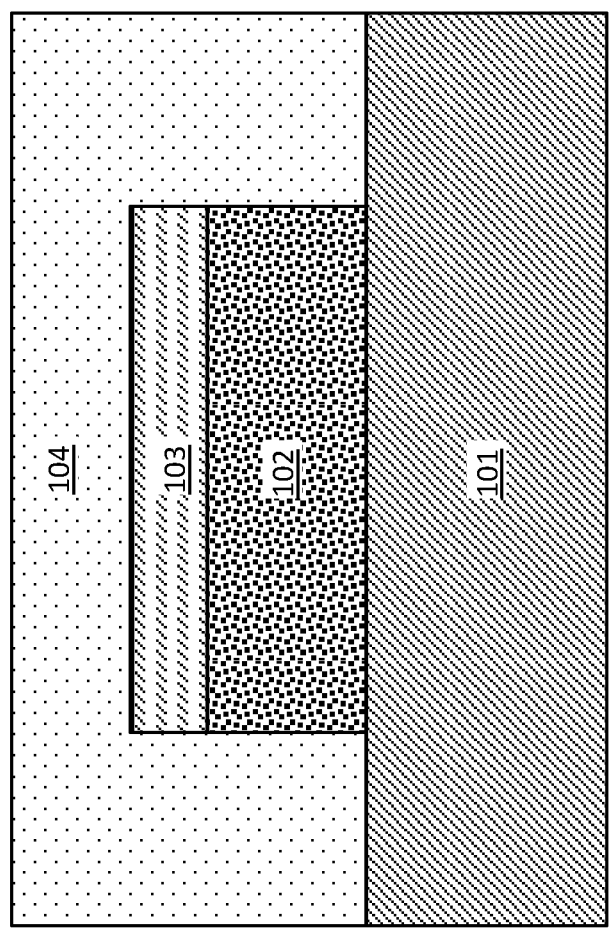

FIG. 1D is a cross-sectional side view after optionally etching the separation layer 102 and the self-destructive layer 103. After depositing the separation layer 102 and the self-destructive layer 103, the separation layer 102 and the self-destructive layer 103 may optionally etched so that the separation layer 102 and the self-destructive layer 103 are sealed on the chip substrate 101, as shown in FIG. 1E described below. One or more etch processes may be employed and depend on the type of materials, layers, and compounds forming the separation layer 102 and the self-destructive layer 103.

FIG. 1E is a cross-sectional side view after depositing a sealant layer 104 on and around the self-destructive layer 103 and the separation layer 102. The sealant layer 104 embeds the self-destructive layer within the chip packaging. The sealant layer 104 protects the self-destructive layer 103 by surrounding the self-destructive layer 103 on a top surface and along sidewalls. The sealant layer 104 also covers the chip substrate 101 to protect the entire chip package.

The one or more materials forming the sealant layer 104 depend on the type of application and the other materials of the chip package. Non-limiting examples of materials for the sealant layer 104 include polyimides, silicon oxides, silicon nitrides, or a combination thereof. The thickness of the sealant layer 104 may generally vary and is not intended to be limited. In some embodiments, the thickness of the sealant layer 104 is in a range from about 1 micrometer to about 100 micrometers, or from about 50 nm to about 1000 nm.

Figure 1F:
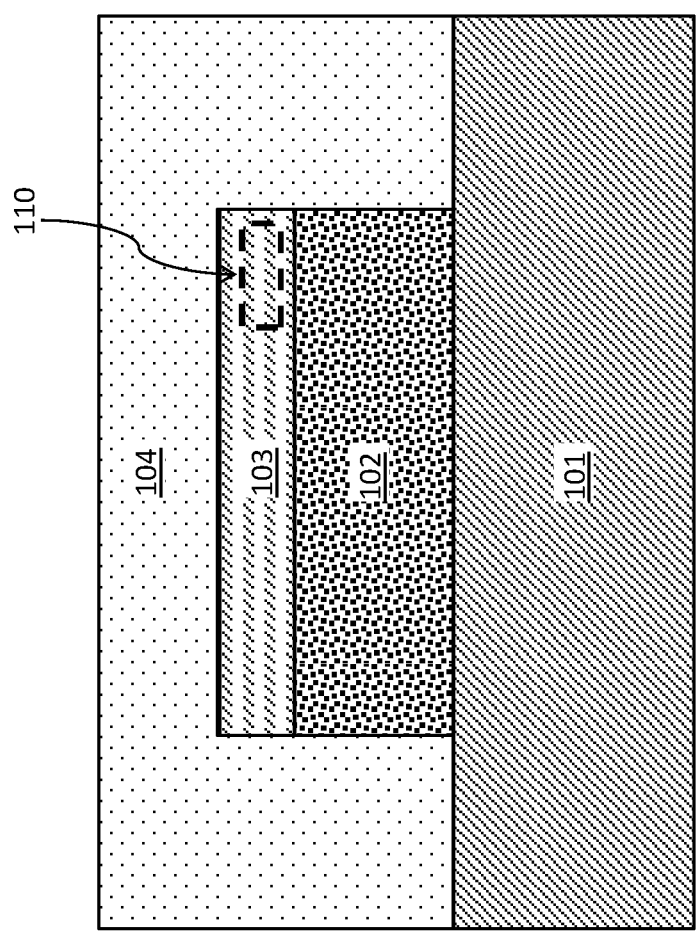

FIG. 1F is a cross-sectional side view of the chip package highlighting a region 110 of the self-destructive layer 103. Expanded views of the region 110 of the self-destructive layer 103 is shown in exemplary embodiments in FIGS. 3A, 3B, 4A, 4B, 6A, and 6B, described below.

Figure 2:
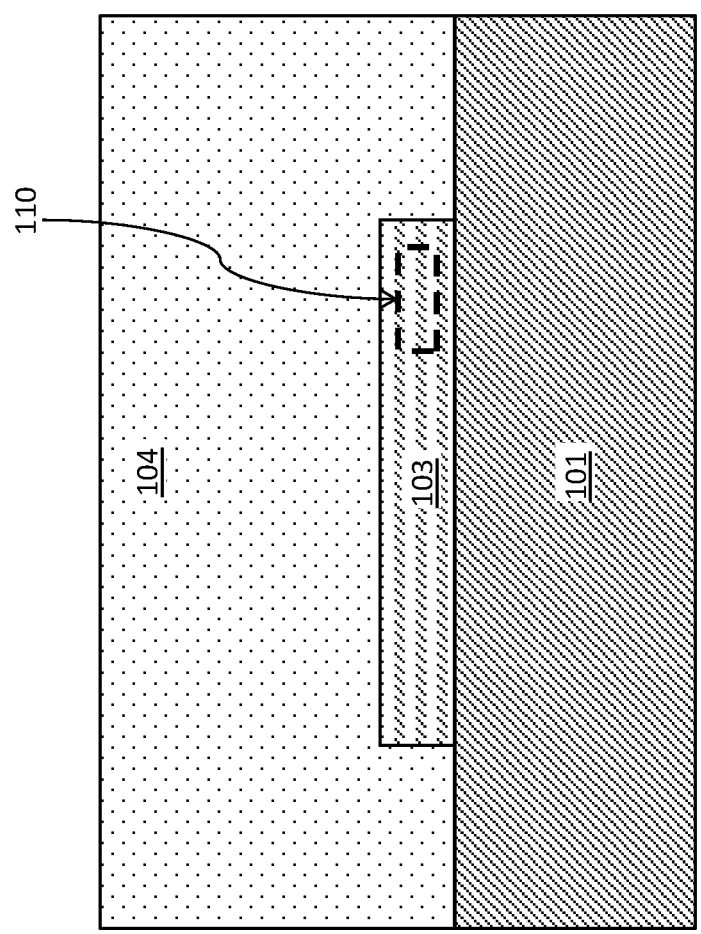
FIG. 2 illustrates a self-destructive layer arranged directly on a chip substrate according to an embodiment.

FIG. 2 illustrates a self-destructive layer 103 arranged directly on a chip substrate 101 according to an embodiment. In addition to being coupled to the chip substrate 101 through a separation layer 102, as shown in FIG. 1F, the self-destructive layer 103 may be formed directly on the chip substrate 101. The self-destructive layer 103 may then be optionally sealed on the surface of the chip substrate 101 by a sealant layer 104, as described above in FIG. 1E.

In other embodiments, the self-destructive layer 103 is arranged on the chip substrate 101 without an additional sealant layer 104 surrounding the self-destructive layer 103 (not shown). The self-destructive layer 103 may be formed and arranged on the chip substrate 101 or embedded within the chip packaging using any methods or packaging schemes.

Figure 3B:
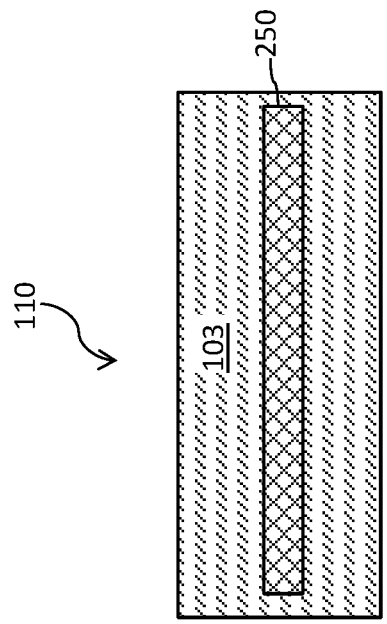
FIG. 3B is an expanded cross-sectional side view of a region of the self-destructive layer according to another embodiment.
Figure 3A:
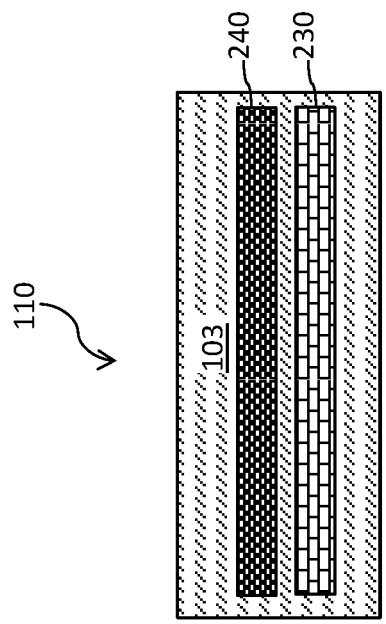
FIG. 3A is an expanded cross-sectional side view of a region of the self-destructive layer according to an embodiment.

FIG. 3A is an expanded cross-sectional side view of the region 110 of the self-destructive layer 103 according to an embodiment. The region 110 is also shown in FIG. 1F and FIG. 2. The self-destructive layer 103 includes two materials/layers or more than two materials/layers. Although two materials/layers are shown and described, the self-destructive layer 103 may include a plurality of any number of materials and/or layers.

As shown in FIG. 3A, the two layers, first layer 230 and second layer 240, are sealed separately within the self-destructive layer 103. The first layer 230 and the second layer 240 include elements, compounds, or materials that will chemically react and/or physically react upon being combined or mixed. Mixing of the elements, materials, or compounds in the first layer 230 and second layer 240 occur upon tampering with the chip packaging. Initially, the first layer 230 and the second layer 240 are deposited separately so that they do not combine or reactant during normal chip operation. The reactants of the first layer 230 and the second layer 240 should be sealed separately from one another.

The materials and compounds of the first layer 230 and the second layer 240 are not intended to be limited. In one exemplary embodiment, the first layer 230 includes sodium, and the second layer 240 includes water. The sodium and water are sealed separately during normal operation. When the package is tampered with or broken, for example if someone attempts to open the package, then the sodium and water combine and react to spontaneously ignite, causing a fire. The fire damages the chip substrate 101 and entire chip package to prevent reverse engineering or undesired analysis. When sodium and water are used, sodium hydroxide (NaOH) and hydrogen gas ($H_2$) are also produced as byproducts. The sodium hydroxide also damages the chip, further preventing reverse engineering and/or analysis. The reaction of sodium with water occurs according to the following reaction scheme: $2Na+2H_2O \rightarrow 2NaOH+H_2$.

The first layer 230 and the second layer 240 may include any two reactive elements, materials, or compounds. The reactive elements may be, for example, alkali metals (e.g., sodium, lithium, cesium, potassium, cesium, francium, or rubidium). A reactive element may be deposited as the first layer 230, and water may then be deposited as the second layer 240. Alkali metals react with water to ignite and cause a fire. As described above for sodium, metal hydroxide and hydrogen gas are also produced as reaction byproducts.

In other embodiments, one or both of the reactants of the first layer 230 and second layer 240 is a pyrophoric substance. Pyrophoric substances ignite spontaneously in air at or below 55° C. (130° F.). Non-limiting examples of pyrophoric substances include tetramethylaluminium (TMA), iron sulfide, and reactive metals, e.g., uranium. Other non-limiting examples of solid pyrophoric substances include solids, such as white phosphorus, alkali metals, alkylated metal alkoxides or nonmetal halides (e.g., diethylethoxyaluminium and dichloro(methyl)silane), metal hydrides (e.g., sodium hydride, lithium aluminum hydride, and uranium trihydride), methane tellurol ($CH_3TeH$), partially or fully alkylated derivatives of metal and nonmetal hydrides (e.g., diethylaluminium hydride, trimethylaluminium, and triethylaluminium, butyllithium), copper fuel cell catalysts, Grignard reagents, iron sulfide, lead and carbon powders produced from decomposition of lead citrate, uranium, neptunium, alkali metals (e.g., lithium, sodium, potassium, rubidium, and cesium), finely divided metals (e.g., iron, aluminum, magnesium, calcium, zirconium, uranium, titanium, bismuth, hafnium, thorium, osmium, and neodymium), or any combination thereof. Pyrophoric materials also may react with water (or humid air) to ignite upon such contact with water or humidity.

FIG. 3B is an expanded cross-sectional side view of the region 110 of the self-destructive layer 103 according to another embodiment. The self-destructive layer 103 includes a single reactive element, compound, or material that is deposited as a single layer 250 that is sealed within the self-destructive layer 103. The reactive element, compound, or material may be, for example, a pyrophoric substance that ignites upon contact with air, water, or humid air, as described above.

Figure 4B:
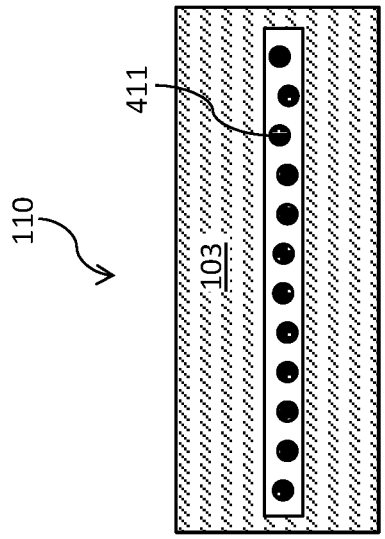
FIG. 4B is an expanded cross-sectional side view of a region of the self-destructive layer according to another embodiment.
Figure 4A:
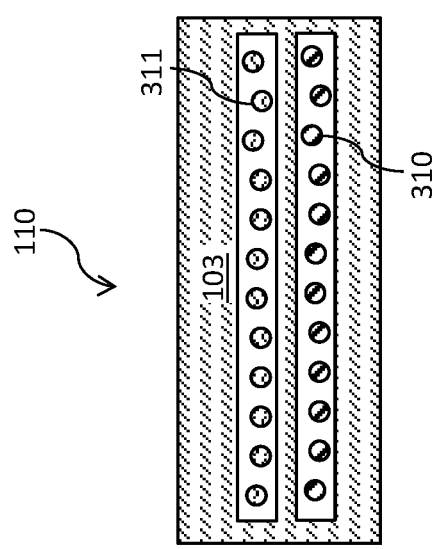
FIG. 4A is an expanded cross-sectional side view of a region of the self-destructive layer according to an embodiment.

FIG. 4A is an expanded cross-sectional side view of the region 110 of the self-destructive layer 103 according to another embodiment. In addition to being formed as individually sealed layers as shown in FIGS. 3A and 3B, the one or more reactive material(s) may be deposited as microvascular networks or scaffolds. For example, the microvascular networks may be deposited as a first microvascular network 310 and a second microvascular network 311 by a direct-write assembly process. The first microvascular network 310 and the second microvascular network 311 may be formed by a robotic deposition process suing a cylindrical nozzle onto a moving x-y stage to form a two-dimensional or three-dimensional pattern. The reactive materials of the first microvascular network 310 and second microvascular network may be any of the materials, such as a pyrophoric material, described above for FIGS. 3A and 3B.

FIG. 4B is an expanded cross-sectional side view of the region 100 of the self-destructive layer 103 according to one embodiment. A single reactive material may be formed in the self-destructive layer 103 as a single microvascular network 411. The reactive material of the single microvascular network 411 may be any reactive material, such as a pyrophoric material, as described above for FIG. 3A or 3B.

FIG. 5A illustrates damage occurring to the chip substrate 101 upon an attempt to open the sealant layer 104 when the self-destructive layer 103 includes two reactive materials arranged as microvascular networks, as shown in FIG. 4A. Following an attempt to open the chip package, the pipes of the first microvascular network 310 and the second microvascular network 311 are broken. Breaks 440 (cracks) in the sealant layer 104 cause the reactant of the first microvascular network 310 and reactant of the second microvascular network 311 to combine and chemically and/or physically react to damage the chip substrate 101, causing physical damage 441. The damage can extend to the entire chip areas, so useful chip information cannot be fully or partially obtained by reserve engineering.

FIG. 5B illustrates damage occurring to the chip substrate 101 upon an attempt to open the sealant layer 104 when the self-destructive layer 103 includes a single reactive material arranged as a microvascular network, as shown in FIG. 4B. Following an attempt to open the chip package, the pipes of the single microvascular network 411 are broken. Breaks 440 (cracks) in the sealant layer 104 cause the reactant of the single microvascular network 411 to be exposed to air (or humid air). Air and the reactant of the single microvascular network 411 chemically and/or physically react to damage the chip substrate 101, causing physical damage 441.

Figure 6B:
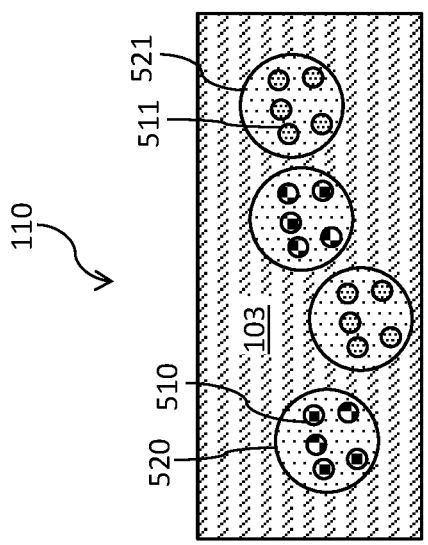
FIG. 6B is a cross-sectional side view of microcapsules including a single reactant that forms the self-destructive layer according to an embodiment.
Figure 6A:
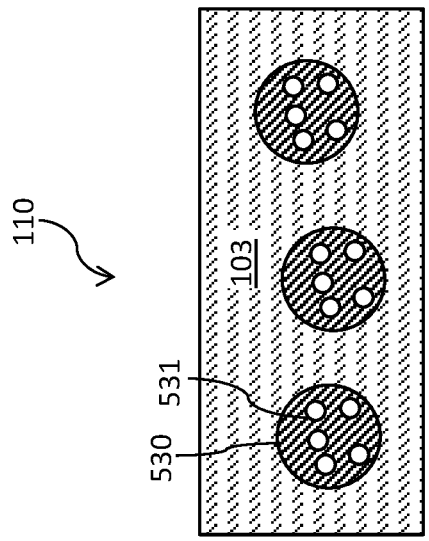
FIG. 6A is a cross-sectional side view of microcapsules including two reactants that form the self-destructive layer according to an embodiment.

FIG. 6A is a cross-sectional side view of microcapsules including two reactants that form the self-destructive layer 103 according to embodiments. A first microcapsule 520 includes a first reactant 510. A second microcapsule 521 includes a second reactant 511. The microcapsules seal and separate the first reactant 510 from the second reactant 511. When the first reactant 510 and the second reactant 511 are sealed separately, they are protected during normal chip operation. The first reactant 510 and second reactant 511 may be any of the reactive elements, compounds, and materials described above in FIGS. 3A and 3B.

FIG. 6B is a cross-sectional side view of microcapsules including a single reactant that forms the self-destructive layer 103 according to embodiments. A single microcapsule 530 includes a single reactant 531. The microcapsule 530 seals and protects the single reactant 531 during normal chip operation. The single reactant 531 may be any of the reactive elements, compounds, and materials described above in FIGS. 3A and 3B.

Figure 7B:
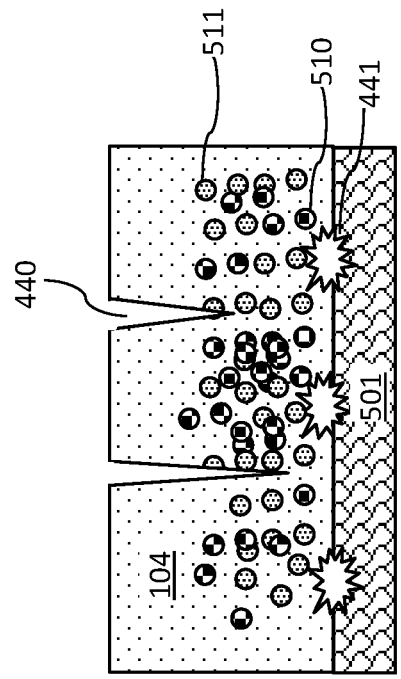
FIG. 7B illustrates damage occurring to the chip substrate of FIG. 7A after being broken.
Figure 7A:
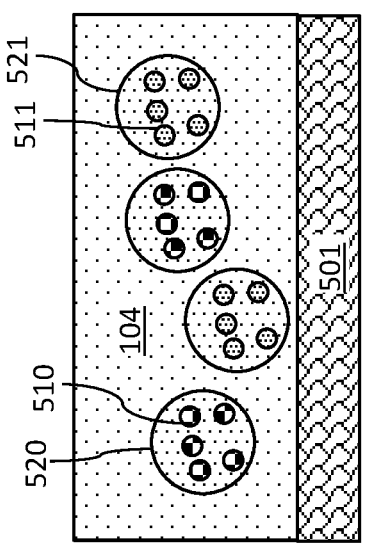
FIG. 7A illustrates the microcapsules sealed with a sealant layer on a chip substrate.

FIG. 7A illustrates the microcapsules of FIG. 6A sealed with a sealant layer 104 on a chip substrate 501. The first microcapsule 520 and second microcapsule 521 may be deposited onto the chip substrate 101 in any order, for example, as a first layer and a second layer. Alternatively, the first microcapsule 520 and the second microcapsule 521 may be deposited together, as the microcapsules surrounding the first reactant 510 and the second reactant 511 protect the reactive materials during normal chip operation.

FIG. 7B illustrates damage occurring to the chip substrate 501 of FIG. 7A after being broken. Following an attempt to open the chip package, the first microcapsule 520 and the second microcapsule 521 are broken. Breaks 440 (cracks) in the sealant layer 104 cause the first reactant 510 of the first microcapsule 520 and the second reactant 511 of the second microcapsule 521 to combine and chemically and/or physically react to damage the chip substrate 501, causing physical damage 441.

Figure 8B:
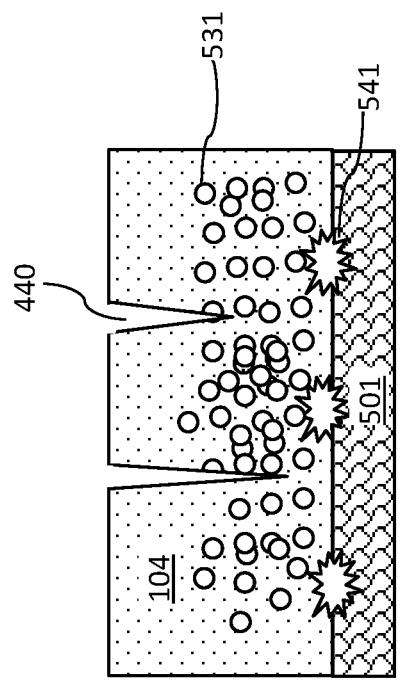
FIG. 8B illustrates damage occurring to the chip substrate of FIG. 8A upon an attempt to open the sealant layer.
Figure 8A:
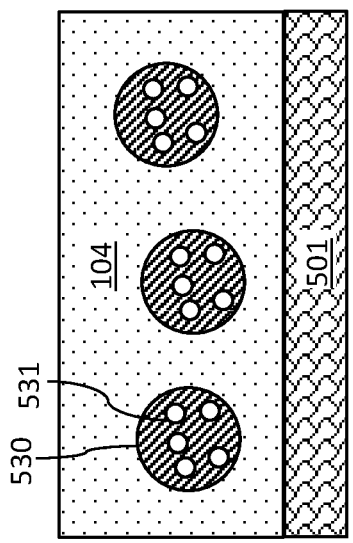
FIG. 8A is a cross-sectional side view of single reactant microcapsules sealed within a sealant layer on a chip substrate.

FIG. 8A is a cross-sectional side view of single reactant microcapsules sealed within a sealant layer 104 on a chip substrate 501. The single microcapsule 530 including the single reactant 531 is deposited onto the chip substrate 501. The microcapsule 530 protects the single reactant 531 during normal chip operation.

FIG. 8B illustrates damage occurring to the chip substrate 501 of FIG. 8A upon an attempt to open the sealant layer 104. Following an attempt to open the chip package, the microcapsule 530 is broken. Breaks 440 (cracks) in the sealant layer 104 cause the single reactant 531 of the microcapsule 530 to be exposed to air and/or humidity, causing chemical and/or physical damage 441 the chip substrate 501.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor chip, the method comprising:
   providing a chip substrate;
   forming a self-destructive layer on the chip substrate, the self-destructive layer comprising a pyrophoric reactant; and
   depositing a sealant layer on a surface of the self-destructive layer, on sidewalls of the self-destructive layer, and on the chip substrate such that the sealant layer forms a package seal on the semiconductor chip;
   wherein the pyrophoric reactant ignites spontaneously upon exposure to humid air and produces a byproduct that damages the chip substrate and to prevent reverse engineering; and the self-destructive layer includes two layers which are sealed separately within the self-destructive layer.

2. The method of claim 1, further comprising depositing a separation layer on the chip substrate between the chip substrate and the self-destructive layer.

3. The method of claim 1, wherein the pyrophoric reactant is formed as a microvascular network within the self-destructive layer.

4. The method of claim 1, wherein the byproduct comprises a metal hydroxide.

5. The method of claim 1, wherein the pyrophoric reactant comprises an alkali metal.

6. The method of claim 1, wherein the pyrophoric reactant is sealed within a microcapsule within the self-destructive layer.

7. A method of making a semiconductor chip, the method comprising:
   providing a chip substrate;
   forming a self-destructive layer on the chip substrate, the self-destructive layer comprising a pyrophoric reactant; and
   depositing a sealant layer on a surface of the self-destructive layer, on sidewalls of the self-destructive layer, and on the chip substrate such that the sealant layer forms a package seal on the semiconductor chip;
   wherein the pyrophoric reactant ignites spontaneously upon exposure to humid air at or below 55° C. and produces a byproduct that damages the chip substrate and to prevent reverse engineering; and the self-destructive layer includes two layers which are sealed separately within the self-destructive layer.

* * * * *